United States Patent
Liao et al.

(10) Patent No.: US 10,274,516 B2
(45) Date of Patent: Apr. 30, 2019

(54) PROBE CARD SYSTEM, PROBE LOADER DEVICE AND MANUFACTURING METHOD OF THE PROBE LOADER DEVICE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chih-Chieh Liao, Hsinchu (TW); Yu-Min Sun, Hsinchu (TW); Chih-Feng Cheng, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 80 days.

(21) Appl. No.: 15/646,042

(22) Filed: Jul. 10, 2017

(65) Prior Publication Data
US 2018/0321278 A1 Nov. 8, 2018

(30) Foreign Application Priority Data
May 3, 2017 (CN) .......................... 2017 1 0302717

(51) Int. Cl.
*G01R 1/067* (2006.01)
*G01R 1/04* (2006.01)

(52) U.S. Cl.
CPC ........... *G01R 1/06705* (2013.01); *G01R 1/04* (2013.01); *G01R 1/06733* (2013.01)

(58) Field of Classification Search
CPC ... G01R 1/06705; G01R 1/06733; G01R 1/04
See application file for complete search history.

(56) References Cited

U.S. PATENT DOCUMENTS

| 6,788,080 | B1 * | 9/2004 | Lenz | .................. | G01R 1/07342 |
| | | | | | 324/754.05 |
| 8,324,923 | B2 * | 12/2012 | Kister | ................ | G01R 1/07307 |
| | | | | | 324/762.1 |

(Continued)

FOREIGN PATENT DOCUMENTS

| EP | 1178320 A2 * | 2/2002 | ......... G01R 1/07342 |
| JP | 01238133 A * | 9/1989 | |

OTHER PUBLICATIONS

Probe Cards—Wentworth Laboratories, p. 2, figure. in col. 1, available at https://www.wentworthlabs.com/wp-content/uploads/2018/06/cantilever-v.1_.pdf on Oct. 20, 2016 (Year: 2016).*

*Primary Examiner* — Daniel R Miller
(74) *Attorney, Agent, or Firm* — CKC & Partners Co., LLC

(57) ABSTRACT

A probe loader device includes a carrier board, a three-dimensional stepped structure and a probe module having a plurality of probe pin layers separately stacked together in three-dimensional stepped structure. The three-dimensional stepped structure is connected to the carrier board. Each of the probe pin layers includes a plurality of cantilever probes. The cantilever probes respectively extend outwards from different steps of the three-dimensional stepped structure, and physical touch a plurality of electrical contacts of a DUT. A portion of each of the cantilever probes extending outwards from the three-dimensional stepped structure has a moment length, and the moment lengths of the cantilever probes of the different probe pin layers are the same.

9 Claims, 8 Drawing Sheets

(56) References Cited

U.S. PATENT DOCUMENTS 9,354,253 B2* 5/2016 Chang ............... G01R 1/07342
2008/0106292 A1* 5/2008 Chui ................ G01R 1/07342
324/750.23

* cited by examiner

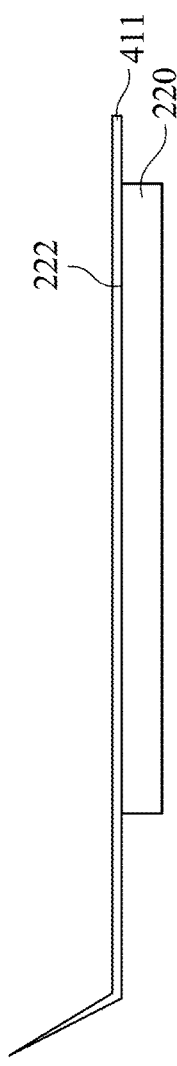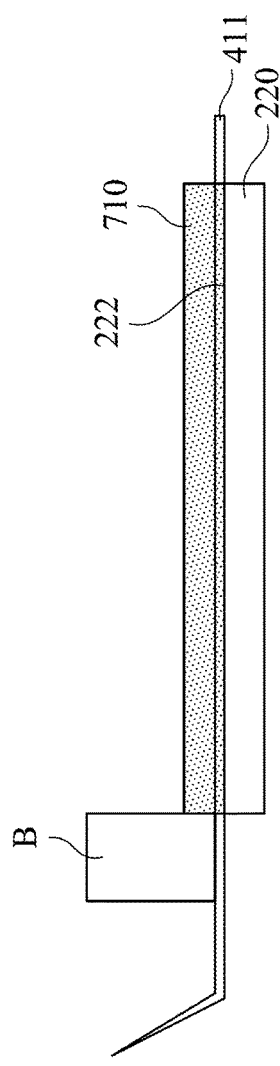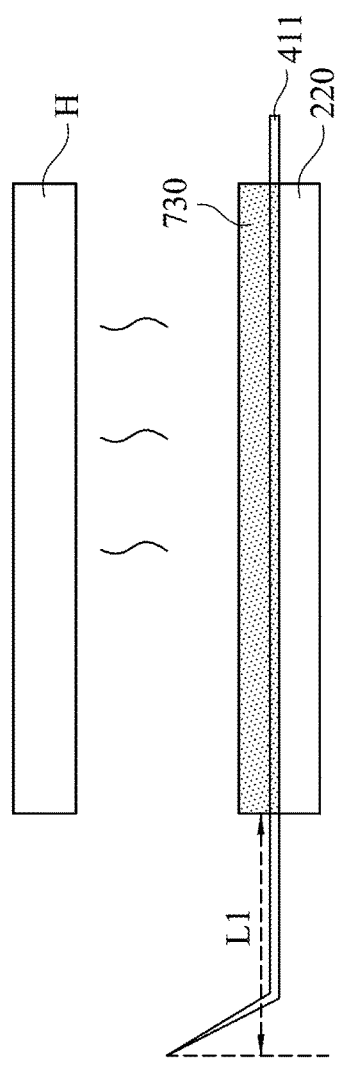

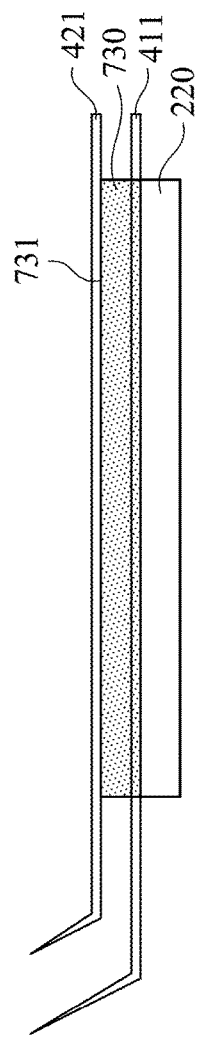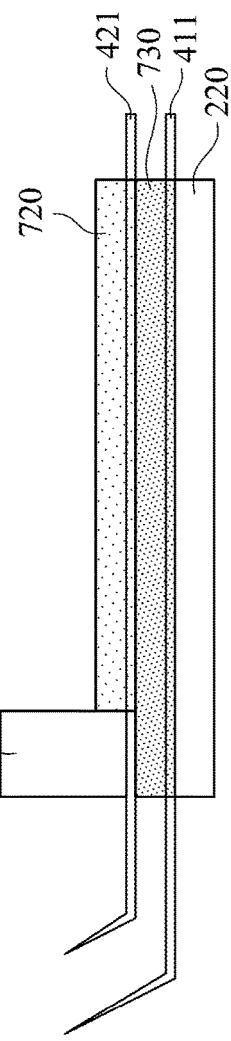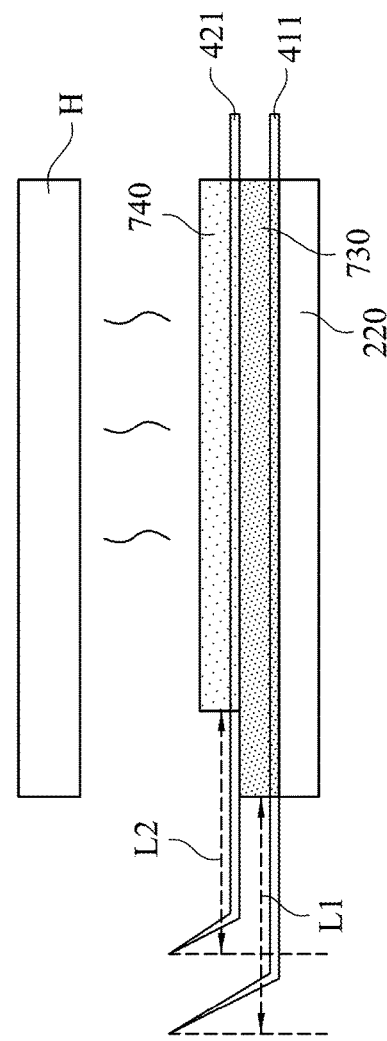

PROBE CARD SYSTEM, PROBE LOADER DEVICE AND MANUFACTURING METHOD OF THE PROBE LOADER DEVICE

RELATED APPLICATIONS

This application claims priority to China Application Serial Number 201710302717.5, filed May 3, 2017, which is herein incorporated by reference.

BACKGROUND

Field of Disclosure

The present disclosure relates to a probe card. More particularly, the present disclosure relates to a probe card system having a cantilever probe, a probe loader device and a manufacturing method of the probe loader device.

Description of Related Art

For testing a manufactured semiconductor product (referred to as a device under test, DUT hereinafter), electrical contacts of the DUT are physically touched by cantilever probes of a testing device in the testing process respectively so as to obtain test results of the DUT after signal transmissions and signal analysis.

However, when the cantilever probes respectively touch different electrical contacts which are respectively located at an inner row and an outer row on the DUT, since the cantilever probes respectively touching different electrical contacts will have different moments of forces, the cantilever probes respectively exert different forces onto the different electrical contacts so that pressed indentation marks with different sizes are formed on the different electrical contacts which are located at different rows on the DUT. Because the electrical contacts located at different rows are exerted with different pressures, it is not guaranteed that the cantilever probes fully and accurately touch all of the electrical contacts of the DUT, thereby causing inaccurate of the test performance of the semiconductor product. Therefore, a tester must spend more time to adjust the configuration variables of the cantilever probes, thereby increasing the difficulty of reassembling the testing device.

Therefore, how to develop a solution to effectively overcome the aforementioned inconvenience and disadvantages is a serious concern for the industry.

SUMMARY

One embodiment of the disclosure is to provide a probe loader device. The probe loader device includes a carrier board, at least one three-dimensional stepped structure and at least one probe module. The three-dimensional stepped structure is connected to the carrier board, and the three-dimensional stepped structure includes a plurality of stepped portions. The stepped portions are sequentially decremented along a direction of being away from the carrier board. The probe module includes a plurality of probe pin layers separately stacked together in the three-dimensional stepped structure. Each of the probe pin layers includes a plurality of cantilever probes which are arranged abreast, and the cantilever probes of the probe pin layers respectively extend outwards from the three-dimensional stepped structure through the different ones of the stepped portions. The cantilever probes of the probe pin layers are used to touch a plurality of electrical contacts of a device under test (DUT).

A portion of each of the cantilever probes extending outwards from the three-dimensional stepped structure has a moment length, and the moment lengths of the cantilever probes of the different probe pin layers are the same.

Another embodiment of the disclosure is to provide a probe card system. The probe card system includes a platform and a probe card device. The platform has a load surface for carrying a device under test (DUT). The DUT has an inner encirclement portion and an outer encirclement portion surrounding the inner encirclement portion, and the inner encirclement portion is provided with a plurality of first electrical contacts, and the outer encirclement portion is provided with a plurality of second electrical contacts. The probe card device is disposed on the platform, and the probe card device includes a circuit board and a probe loader device. The probe loader device includes a carrier board, a pin holding portion and at least one probe module. The pin holding portion is disposed on one surface of the carrier board, and the pin holding portion includes at least one three-dimensional stepped structure connected to the carrier board. The three-dimensional stepped structure includes at least one first step surface, at least one second step surface and at least one connecting surface. The first step surface surrounds to form a first space area. The second step surface surrounds to form a second space area which is in communication with the first space area and greater than the first space area. The connecting surface adjoins the first step surface and the second step surface. The probe module is electrically connected to the circuit board, and the probe module includes at least one first probe pin layer and at least one second probe pin layer. The first probe pin layer and the second probe pin layer are separately stacked together in the pin holding portion. The first probe pin layer includes a plurality of first cantilever probes respectively extending outwards from the three-dimensional stepped structure through the first step surface and touching the first electrical contacts. The second probe pin layer includes a plurality of second cantilever probes respectively extending outwards from the three-dimensional stepped structure through the second step surface and touching the second electrical contacts. A portion of each of the first cantilever probes extending outwards from the three-dimensional stepped structure has a first moment length, a portion of each of the second cantilever probes extending outwards from the three-dimensional stepped structure has a second moment length which is the same as the first moment length.

Another embodiment of the disclosure is to provide a manufacturing method of a probe loader device. The manufacturing method of the probe loader device includes steps as follows. A first cantilever probe is disposed on a carrier board. A first colloid body is applied to cover the first cantilever probe and the carrier board. The first colloid body is cured to be a first curing layer so that the first cantilever probe is fixed in the first curing layer, and one portion of the first cantilever probe extends outwards from the first curing layer, and the portion of the first cantilever probe has a first moment length. A second cantilever probe is disposed on one surface of the first curing layer opposite to the carrier board. A second colloid body is applied to cover the second cantilever probe and the first curing layer. The second colloid body is cured to be a second curing layer which is more concaved inwardly than the first curing layer so that the second curing layer and the first curing layer collectively form a three-dimensional stepped structure, and the second cantilever probe is fixed in the second curing layer, and one portion of the second cantilever probe extends outwards from the second curing layer, and the portion of the second cantilever probe has a second moment length which is the same as the first moment length.

Therefore, through the probe card system, the probe loader device and the manufacturing method of the probe loader device, the aforementioned cantilever probes can exert to respectively touch the different electrical contacts with the same pressures so that pressed indentation marks with substantially the same size are formed on the different electrical contacts. Thereby decreasing the difficulty of reassembling the probe loader device to another DUT.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

FIG. 7A to FIG. 7F are operational schematic views of the flow chart of FIG. 6.

DESCRIPTION OF THE EMBODIMENTS

Figure 1:
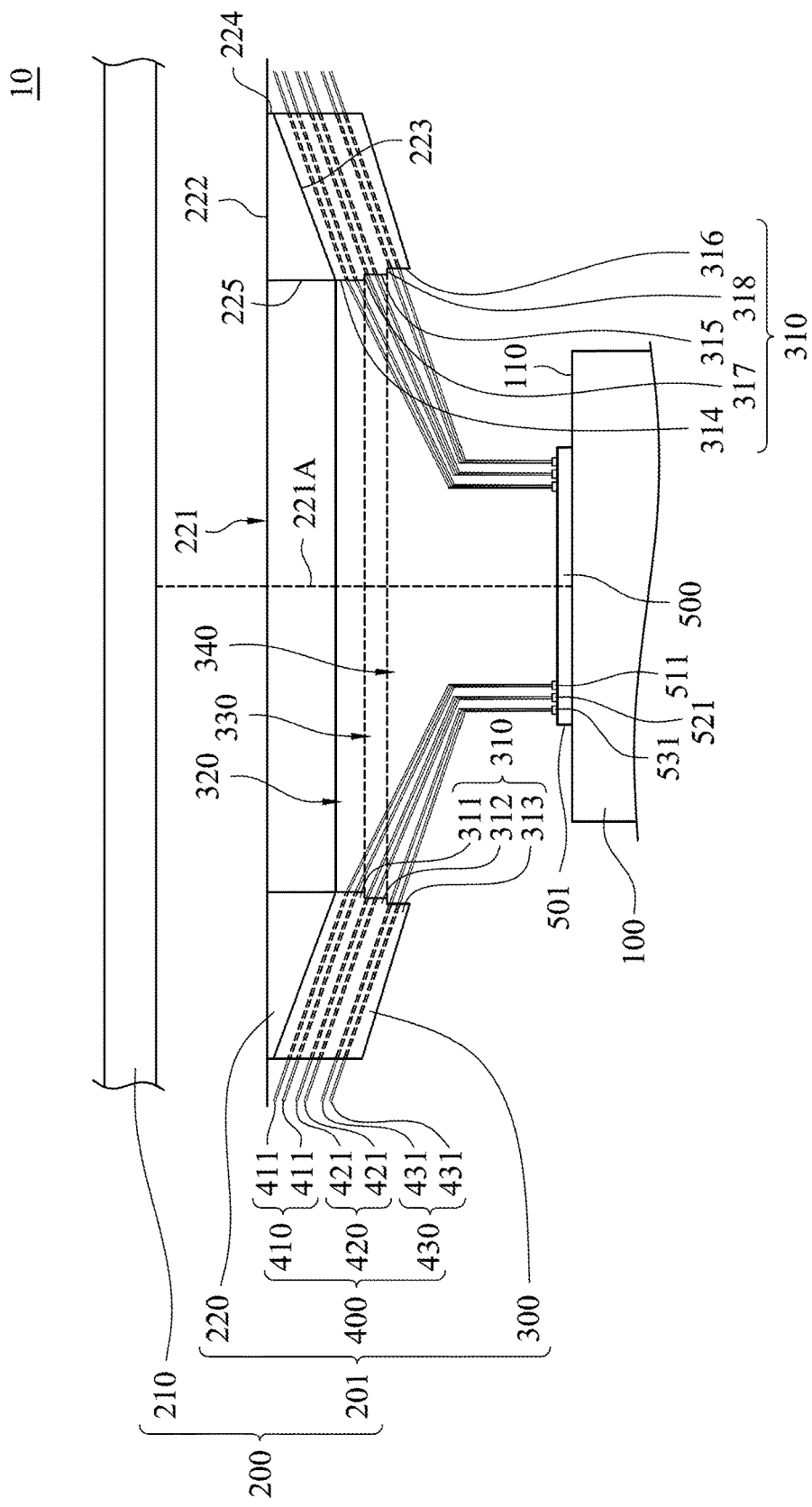
FIG. 1 is a side view of a probe card system according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

Figure 2:
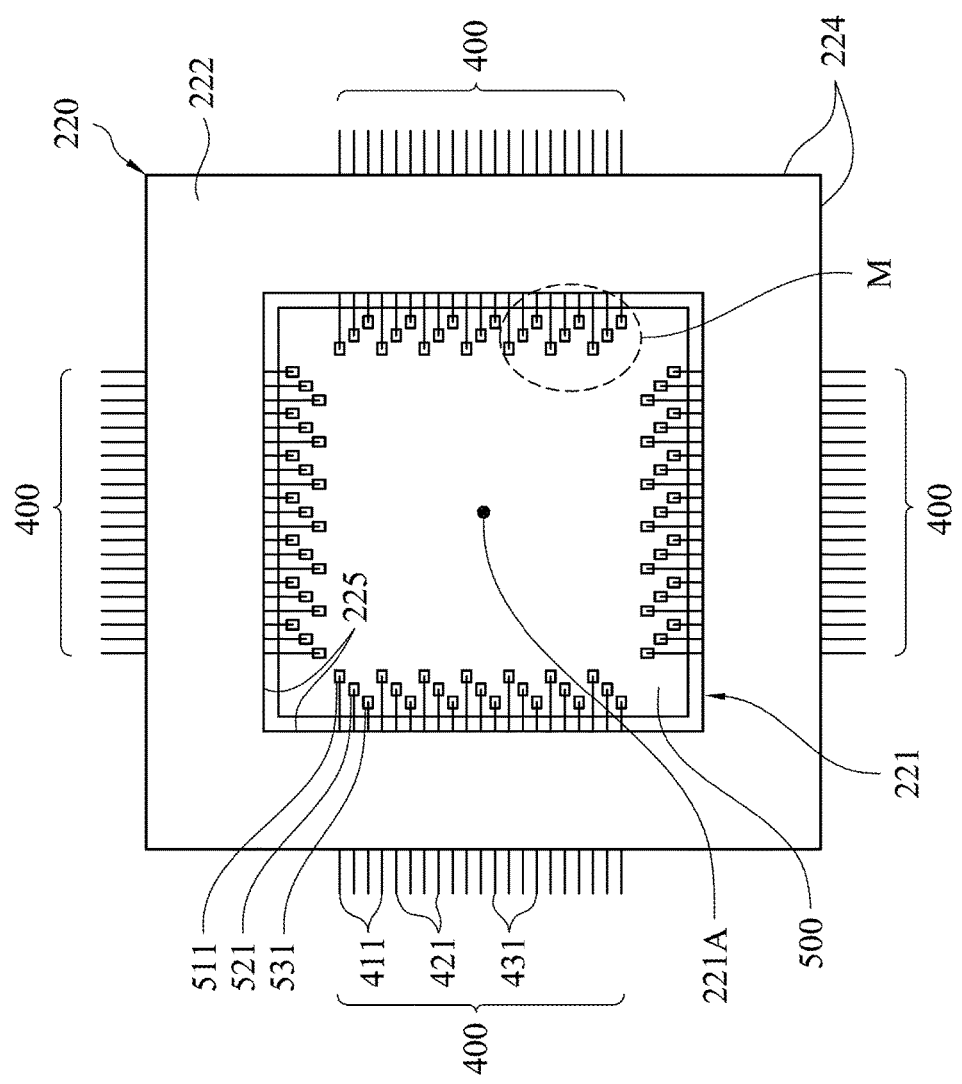
FIG. 2 is a top view of a probe card device of FIG. 1.

Reference is now made to FIG. 1 and FIG. 2, in which FIG. 1 is a side view of a probe card system 10 according to one embodiment of the disclosure, and FIG. 2 is a top view of a probe card device 200 of FIG. 1. As shown in FIG. 1 and FIG. 2, in the embodiment, the probe card system 10 includes a platform 100 and a probe card device 200. The platform 110 has a load surface 110. The load surface 110 is used to carry a DUT 500 (e.g., semiconductor product) thereon. The probe card device 200 is disposed above the platform 100. The probe card device 200 includes a probe loader device 201 and a circuit board 210. The probe loader device 201 includes a carrier board 220, a pin holding portion 300 and one or more probe modules 400. The pin holding portion 300 is connected to the carrier board 220. Exemplarily, the carrier board 220 is disposed between the pin holding portion 300 and the circuit board 210. One surface of the pin holding portion 300 is provided with a three-dimensional stepped structure 310. The three-dimensional stepped structure 310 includes a first stepped portion 311, a second stepped portion 312 and a third stepped portion 313. The first stepped portion 311, the second stepped portion 312 and the third stepped portion 313 are arranged in order along a direction of being away from the carrier board 220, and the first stepped portion 311, the second stepped portion 312 and the third stepped portion 313 are sequentially decremented in size along the direction of being away from the carrier board 220, that is, in the pin holding portion 300, the third stepped portion 313 is more concaved inwardly than the second stepped portion 312, and the second stepped portion 312 is more concaved inwardly than the first stepped portion 311. The probe modules 400 are disposed in the pin holding portion 300 in which a portion of each of the probe modules 400 is electrically connected to the circuit board 210, another portion of each of the probe modules 400 is electrically connected to the DUT 500. Thus, the circuit board 210 is used to be electrically connected to the DUT 500 though the probe modules 400. Each of the probe modules 400 includes a plurality of probe pin layers separately stacked together in the three-dimensional stepped structure 310. The probe pin layers are exemplarily referred to be a first probe pin layer 410, a second probe pin layer 420 and a third probe pin layer 430. Each of the probe pin layers includes a plurality of cantilever probes which are arranged abreast, in the embodiment, the cantilever probes are parallel to one another. However, the disclosure is not limited thereto. These cantilever probes are exemplarily divided into first cantilever probes 411, second cantilever probes 421 and third cantilever probes 431. The first cantilever probes 411, the second cantilever probes 421 and the third cantilever probes 431 extend outwards from the three-dimensional stepped structure 310 through the first stepped portion 311, the second stepped portion 312 and the third stepped portion 313, respectively so that the first cantilever probes 411, the second cantilever probes 421 and the third cantilever probes 431 are used to touch the first electrical contacts 511, second electrical contacts 521 and third electrical contacts 531, respectively.

Specifically, the carrier board 220 includes a through hole 221, a first main surface 222, a second main surface 223, one or more inner lateral surfaces 225 and one or more outer lateral surfaces 224. The second main surface 223 is opposite to the first main surface 222. The through hole 221 is surrounded by the inner lateral surfaces 225. The through hole 221 penetrates through the carrier board 220 along an axial line 221A of the through hole 221 to connect the first main surface 222 and the second main surface 223. The outer lateral surfaces 224 are disposed between the first main surface 222 and the second main surface 223, and adjoin the first main surface 222 and the second main surface 223, and surround the inner lateral surfaces 225, the through hole 221, the first main surface 222 and the second main surface 223. In the embodiment, the axial line 221A of the through hole 221 passes through the load surface 110 of the platform 100, and is substantially vertical to the load surface 110 of the platform 100, however, the disclosure is not limited thereto. The pin holding portion 300 is connected to the first main surface 222 of the carrier board 220, and the pin holding portion 300 surrounds the axial line 221A. The three-dimensional stepped structure 310 is formed on one surface of the pin holding portion 300 facing towards the axial line 221A. The three-dimensional stepped structure 310 includes a first step surface 314, a second step surface 315, a third step surface 316, a first connecting surface 317 and a second connecting surface 318. The first step surfaces 314 collectively surround the axial line 221A to form a first space area 320. The first space area 320 is in communication with the through hole 221. The second step surfaces 315 collectively surround the axial line 221A to form a second space area 330. The first space area 320 is located between the through hole 221 and the second space area 330, and is in communication with the through hole 221 and the second space area 330, and the second space area 330 is greater than the first space area 320. The third step surfaces 316 collectively surround the axial line 221A to form a third space area 340. The third space area 340 is greater than the second space area 330 and the first space area 320. The second space area 330 is located between the first space area 320 and the third space area 340, and is in communication with the first space area 320 and the third space area 340. The first connecting surface 317 adjoins the first step surface 314 and the second step surface 315. The second connecting surface 318 adjoins the second step surface 315 and the third step surface 316.

Figure 3:
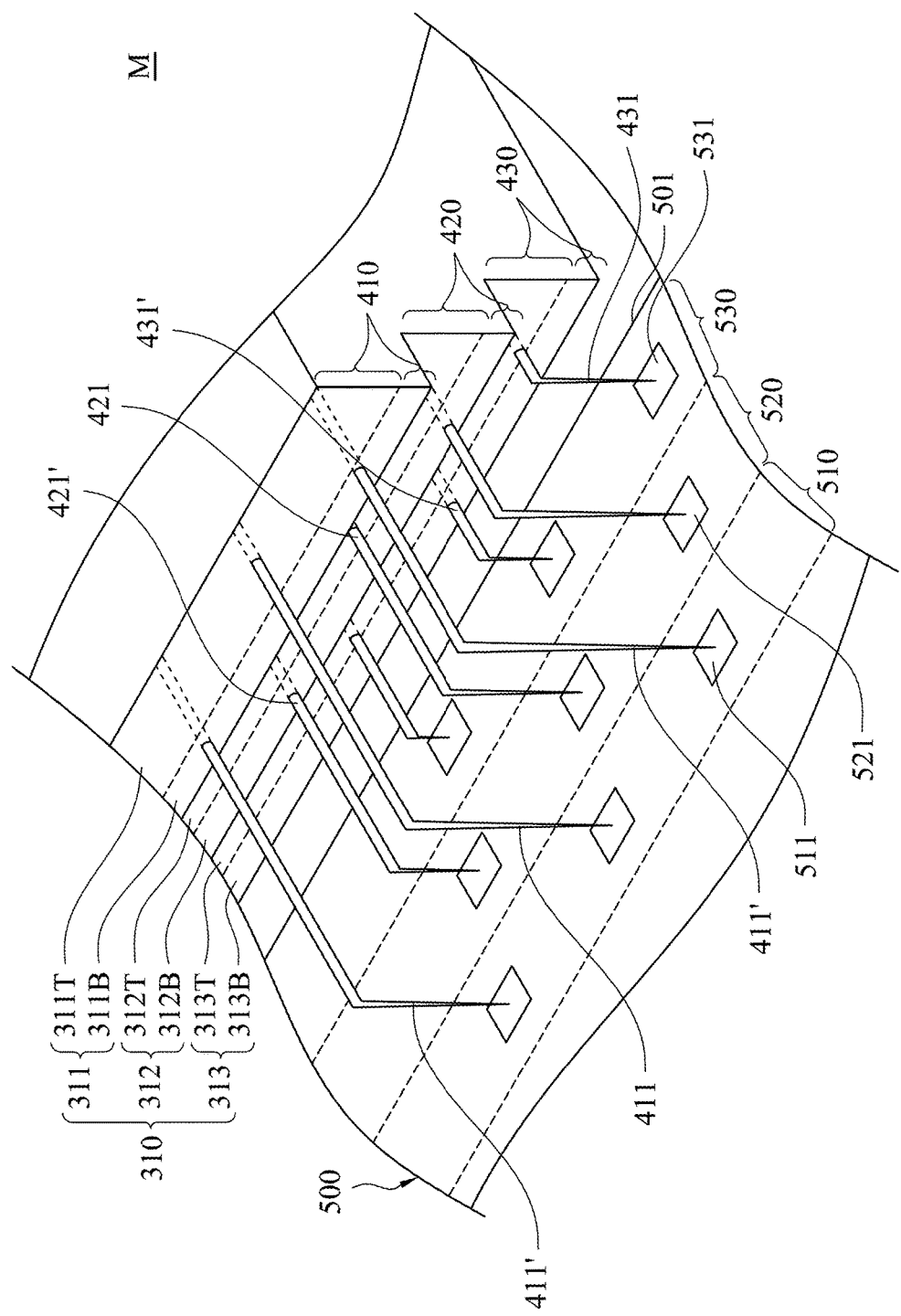
FIG. 3 is a partial three-dimensional view of a partial location of a probe card device of FIG. 1 in which the partial location is same as a local zone M of the probe card device of FIG. 2.

FIG. 3 is a partial three-dimensional view of a partial location of a probe card device of FIG. 1 in which the partial location is same as a local zone M of the probe card device of FIG. 2. As shown in FIG. 1 and FIG. 3, the probe modules 400 includes the aforementioned first probe pin layer 410, second probe pin layer 420 and third probe pin layer 430. The aforementioned first probe pin layer 410, the second probe pin layer 420 and the third probe pin layer 430 are separately stacked together along the axial line 221A. The aforementioned first probe pin layer 410 includes a plurality of first cantilever probes 411 which are arranged abreast. In the embodiment, the first cantilever probes 411 are substantially parallel to one another, however, the disclosure is not limited thereto. Each of the first cantilever probes 411 is partially embedded in the first stepped portion 311 in which one end of each of the first cantilever probes 411 is welded on the circuit board 210, and the other end of each of the first cantilever probes 411 extends outwards from the first stepped portion 311 through the first step surface 314. The aforementioned second probe pin layer 420 includes a plurality of second cantilever probes 421 which are arranged abreast. In the embodiment, the second cantilever probes 421 are substantially parallel to one another, however, the disclosure is not limited thereto. Each of the second cantilever probes 421 is partially embedded in the second stepped portion 312 in which one end of each of the second cantilever probes 421 is welded on the circuit board 210, and the other end of each of the second cantilever probes 421 extends outwards from the second stepped portion 312 through the second step surface 315.

The aforementioned third probe pin layer 430 includes a plurality of third cantilever probes 431 which are arranged abreast. In the embodiment, the third cantilever probes 431 are substantially parallel to one another, however, the disclosure is not limited thereto. Each of the third cantilever probes 431 is partially embedded in the third stepped portion 313 in which one end of each of the third cantilever probes 431 is welded on the circuit board 210, and the other end of each of the third cantilever probes 431 extends outwards from the third stepped portion 313 through the third step surface 316.

Figure 4:
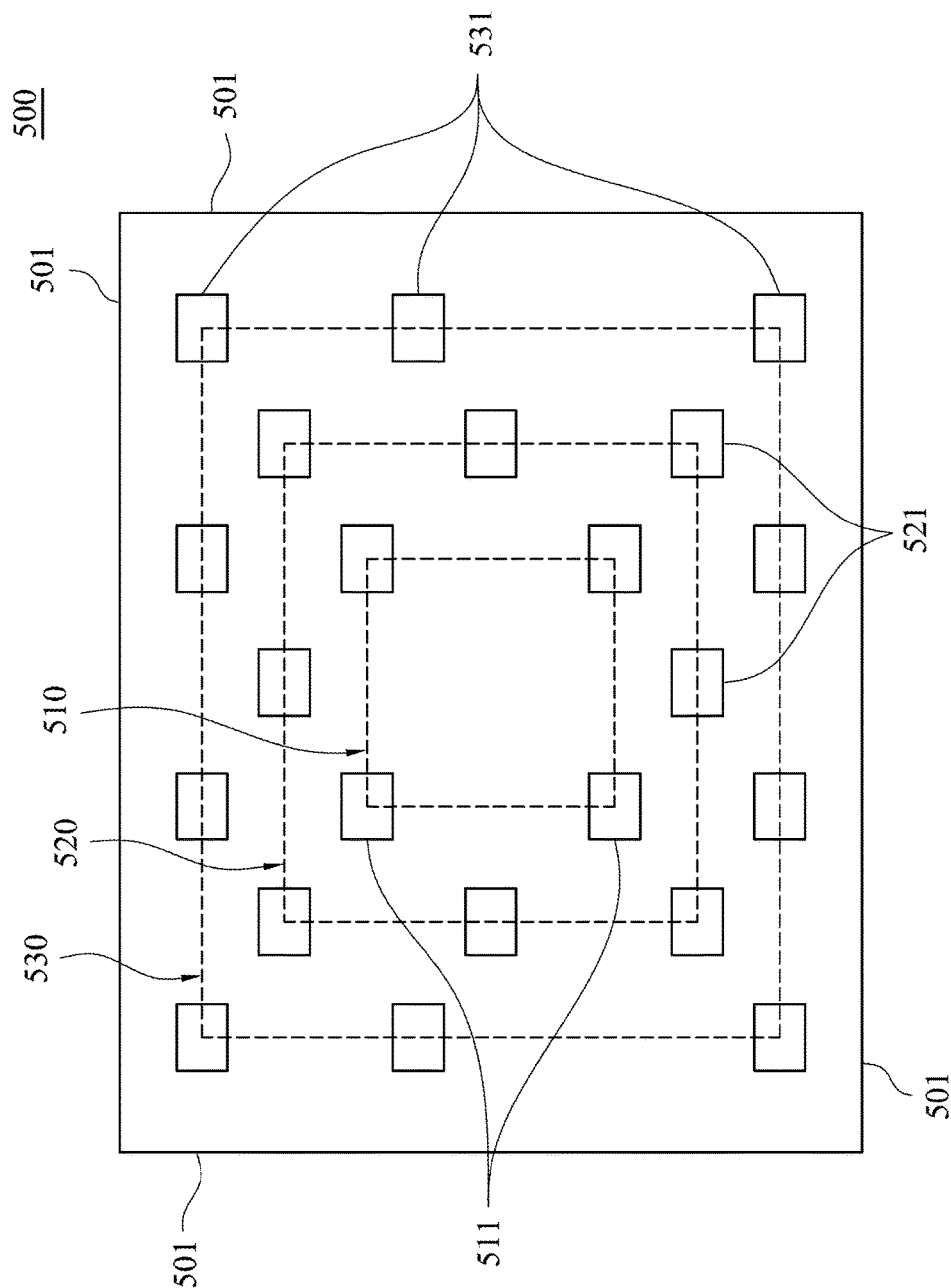
FIG. 4 is a top view of a device under test (DUT) of FIG. 1.

FIG. 4 is a top view of a device under test (DUT) 500 of FIG. 1. As shown in FIG. 3 and FIG. 4, one surface of the DUT 500 is provided with an inner encirclement portion 510, a middle encirclement portion 520 and an outer encirclement portion 530. The middle encirclement portion 520 is arranged between the inner encirclement portion 510 and the outer encirclement portion 530. The middle encirclement portion 520 surrounds the inner encirclement portion 510. The outer encirclement portion 530 surrounds the inner encirclement portion 510 and the middle encirclement portion 520. The inner encirclement portion 510 is provided with a plurality of first electrical contacts 511. The first cantilever probes 411 which individually extend outwards from the first stepped portion 311 through the first step surface 314 (FIG. 1) electrically touch the first electrical contacts 511, respectively. The middle encirclement portion 520 is provided with a plurality of second electrical contacts 521. The second cantilever probes 421 which individually extend outwards from the second stepped portion 312 through the second step surface 315 (FIG. 1) electrically touch the second electrical contacts 521, respectively. The third cantilever probes 431 which extend outwards from the third stepped portion 313 through the third step surface 316 (FIG. 1) electrically touch the third electrical contacts 531, respectively. Compared among the outer encirclement portion 530, the middle encirclement portion 520 and the inner encirclement portion 510, the outer encirclement portion 530 (i.e., the third electrical contacts 531) is closest to an outer edge 501 of the DUT 500, the middle encirclement portion 520 (i.e., the second electrical contacts 521) is the next one closest to the outer edge 501 of the DUT 500, and the inner encirclement portion 510 (i.e., the first electrical contacts 511) is farthest from the outer edge 501 of the DUT 500. The first electrical contacts 511 of the inner encirclement portion 510, the second electrical contacts 521 of the middle encirclement portion 520 and the third electrical contacts 531 of the outer encirclement portion 530 are arranged staggered one another. Thus, the corresponding first cantilever probes 411, the corresponding second cantilever probes 421 and the corresponding third cantilever probes 431 are also staggered one another.

It is noted, although the first electrical contacts 511, the second electrical contacts 521 and the third electrical contacts 531 arranged on the DUT 500 shown in FIG. 2 and FIG. 4 are staggered one another, it does not mean that the electrical contacts located at inner/outer encirclement portions of all kinds of the DUT have to staggered one another. One with ordinary skill in the art of the disclosure may modify the arrangement of all of the electrical contacts located at inner/outer encirclement portions on any DUT at discretion according to actual requirements and restrictions. For example, the first electrical contacts, the second electrical contacts and the third electrical contacts are aligned linearly. Thus, one of the first cantilever probes, one of the second cantilever probes and one of the third cantilever probes are overlapped one another vertically. However, the disclosure is not limited thereto. The probe modules 400 and the three-dimensional stepped structures 310 are respectively plural, and the three-dimensional stepped structures 310 are separately arranged to collectively surround the axial line 221A, and all of the cantilever probes extending outwards from the three-dimensional stepped structures 310 respectively extend towards the axial line 221A.

Back to FIG. 3, as the first probe pin layer 410 can be plural, two neighboring ones of the first probe pin layers 410 are both disposed in the first stepped portion 311 of the three-dimensional stepped structure 310; that is, the two first probe pin layers 410 are separately stacked in an upper sublayer 311T and a lower sublayer 311B of the first stepped portion 311. Thus, the first cantilever probes 411, 411' which are vertically stacked with each other and respectively embedded in the upper sublayer 311T and the lower sublayer 311B extend outwards from the first stepped portion 311 through the same step surface (e.g., the first step surface 314, FIG. 1). Furthermore, since the first cantilever probes 411, 411' which are vertically stacked with each other and respectively embedded in the upper sublayer 311T and the lower sublayer 311B can respectively physically touch these first electrical contacts 511 of the DUT 500, the first cantilever probes 411, 411' are arranged alternatively on the DUT 500. Therefore, in the embodiment, the DUT 500 with more first electrical contacts 511 can be tested. As the second probe pin layer 420 can be plural, two neighboring ones of the second probe pin layers 420 are both disposed in the second stepped portion 312 of the three-dimensional stepped structure 310; that is, the two second probe pin layers 420 are separately stacked in an upper sublayer 312T and a lower sublayer 312B of the second stepped portion 312. Thus, the second cantilever probes 421, 421' which are vertically stacked with each other and respectively embedded in the upper sublayer 312T and the lower sublayer 312B extend outwards from the second stepped portion 312 through the same step surface (e.g., the second step surface 315, FIG. 1). Furthermore, since the second cantilever probes 421, 421' which are vertically stacked with each other and respectively embedded in the upper sublayer 312T and the lower sublayer 312B can respectively physically touch these second electrical contacts 521 of the DUT 500, the second cantilever probes 421, 421' are arranged alternatively on the DUT 500. Therefore, in the embodiment, the DUT 500 with more second electrical contacts 521 can be tested.

As the third probe pin layer 430 can be plural, two neighboring ones of the third probe pin layers 430 are both disposed in the third stepped portion 313 of the three-dimensional stepped structure 310; that is, the two third probe pin layers 430 are separately stacked in an upper sublayer 313T and a lower sublayer 313B of the third stepped portion 313. Thus, the third cantilever probes 431, 431 which are vertically stacked with each other and respectively embedded in the upper sublayer 313T and the lower sublayer 313B extend outwards from the third stepped portion 313 through the same step surface (e.g., the third step surface 316, FIG. 1). Furthermore, since the third cantilever probes 431, 431' which are vertically stacked with each other and respectively embedded in the upper sublayer 313T and the lower sublayer 313B can respectively physically touch these third electrical contacts 531 of the DUT 500, the third cantilever probes 431, 431' are arranged alternatively on the DUT 500. Therefore, in the embodiment, the DUT 500 with more third electrical contacts 531 can be tested.

However, the disclosure is not limited thereto, in another embodiment, any single probe pin layer of the probe modules 400 also can be embedded in a single stepped portion only.

Figure 5:
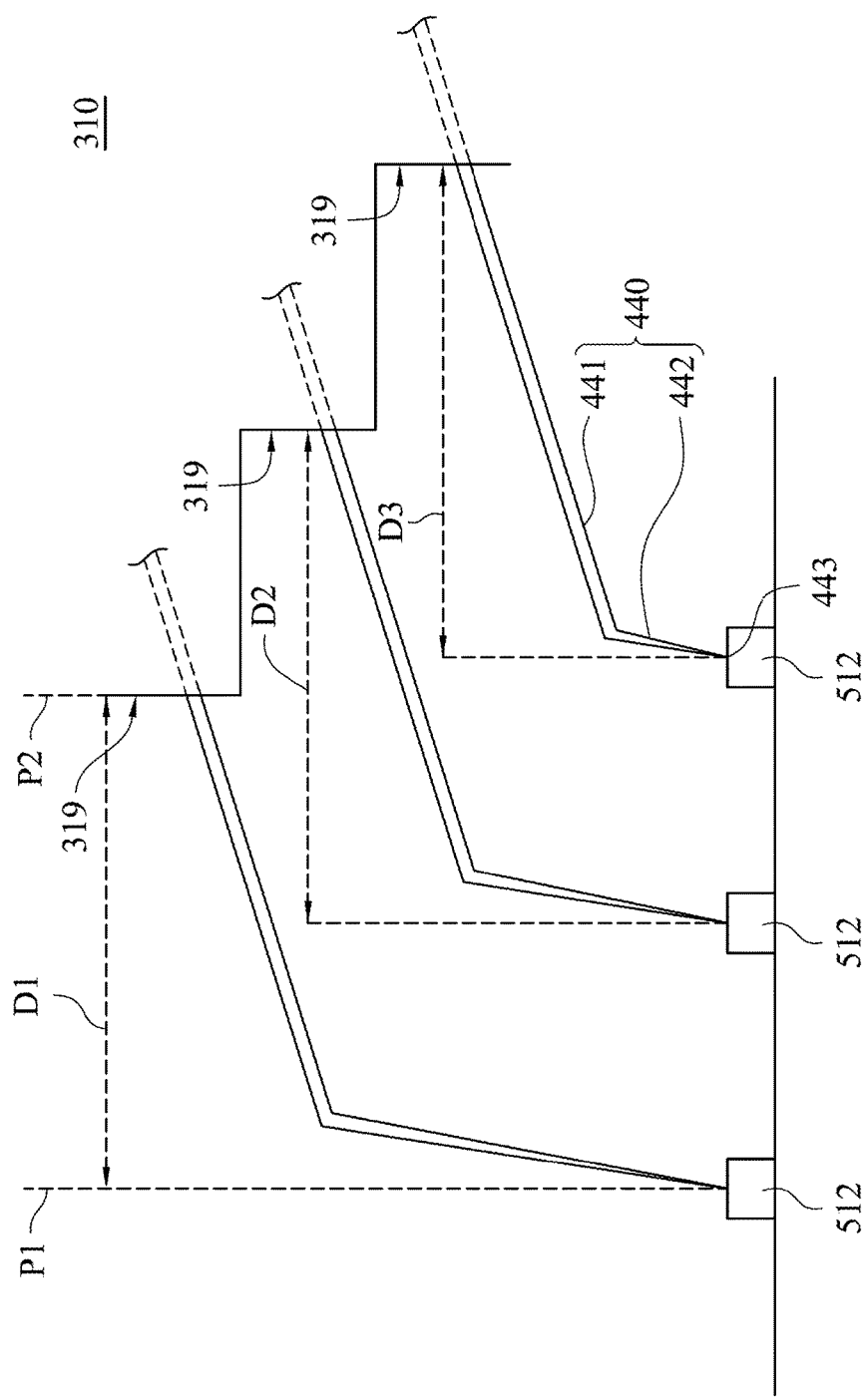
FIG. 5 is a side view of cantilever probes of a probe card system according to one embodiment of the disclosure.

FIG. 5 is a side view of cantilever probes 440 of a probe card system according to one embodiment of the disclosure. As shown in FIG. 5, each of the cantilever probes 440 includes a suspended portion 441 and a bending portion 442 which is connected to the suspended portion 441. The suspended portion 441 is partially embedded in the three-dimensional stepped structure 310, and a needle end 443 of the bending portion 442 which is out of the three-dimensional stepped structure 310 is used to physically touch one of the electrical contacts 512. A portion of each of the cantilever probes 440 extending outwards from the three-dimensional stepped structure 310 has a moment length. The moment length of each of the cantilever probes 440 is a minimum straight distance D1 defined between a first virtual plane P1 and a second virtual plane P2 in which the first virtual plane P1 and the second virtual plane P2 are parallel to each other, the second virtual plane P2 is same as a step surface 319, which one of the cantilever probes 440 extends through, and the first virtual plane P1 passes through the needle end 443 of the cantilever probe 440 extending through the step surface 319.

Thus, since the moment lengths (i.e., minimum straight distance D1, D2, D3) of the cantilever probes 440 are the same one another, the aforementioned cantilever probes 440 can exert to respectively touch the different electrical contacts 512 with the same pressures so that pressed indentation marks with substantially the same size are formed on the different electrical contacts 512. Thereby decreasing the difficulty of reassembling the probe loader device to another DUT.

Figure 6:
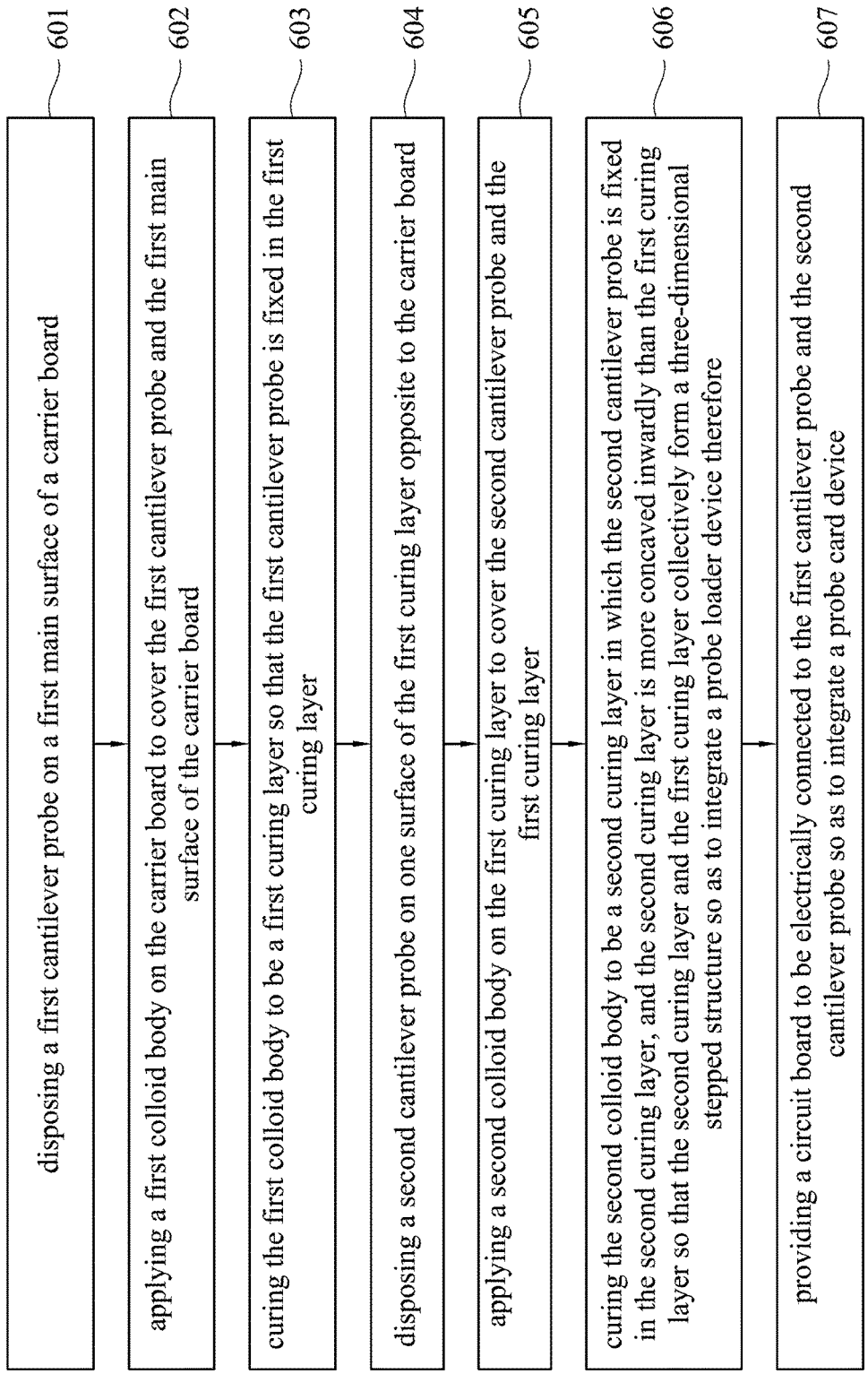
FIG. 6 is a flow chart of a manufacturing method of a probe card system according to one embodiment of the disclosure.

FIG. 6 is a flow chart of a manufacturing method of a probe card system according to one embodiment of the disclosure. FIG. 7A to FIG. 7F are operational schematic views of the flow chart of FIG. 6. As shown in FIG. 6, the manufacturing method of a probe card system includes step 601 to step 606 outlined as follows. In step 601, as shown in FIG. 7A, a first cantilever probe 411 is disposed on a first main surface 222 of a carrier board 220. In step 602, as shown in FIG. 7B, a first colloid body 710 is applied on the carrier board 220 to cover the first cantilever probe 411 and the first main surface 222 of the carrier board 220. For example, the leading directions of the first colloid body 710 being applied on the carrier board 220 can be guided by a baffle B so as to adjust the coating position of the first colloid body 710. In step 603, as shown in FIG. 7C, the first colloid body 710 (FIG. 7B) is cured to be a first curing layer 730 so that the first cantilever probe 411 is fixed in the first curing layer 730 in which one portion of the first cantilever probe 411 extends outwards from the first curing layer 730, and the portion extending outwards from the first curing layer 730 has a first moment length L1. For example, the first colloid body 710 (FIG. 7B) is heated to be transformed as the first curing layer 730 through a heating device H. In step 604, as shown in FIG. 7D, a second cantilever probe 421 is disposed on one surface 731 of the first curing layer 730 opposite to the carrier board 220. In step 605, as shown in FIG. 7E, a second colloid body 720 is applied on the first curing layer 730 to cover the second cantilever probe 421 and the first curing layer 730. For example, the leading directions of the second colloid body 720 being applied on the first curing layer 730 can be guided by the baffle B so as to adjust the coating position of the second colloid body 720 for being protruded in relation to the first curing layer 730. The protruding degree of the second colloid body 720 in relation to the first curing layer 730 is substantially equal to a gap between any two electrical contacts which are located in any two neighboring rows on the DUT. In step 606, as shown in FIG. 7F, the second colloid body 720 (FIG. 7E) is cured to be a second curing layer 740 so that the second cantilever probe 421 is fixed in the second curing layer 740 in which one portion of the second cantilever probe 421 extends outwards from the second curing layer 740, and the portion extending outwards from the second curing layer 740 has a second moment length L2 which is same as the first moment length L1. For example, the second colloid body 720 (FIG. 7E) is heated to be transformed as the second curing layer 740 through a heating device H. Therefore, in FIG. 7F, the second curing layer 740 is more concaved inwardly than the first curing layer 730 so that the second curing layer 740 and the first curing layer 730 collectively form a three-dimensional stepped structure 310 (FIG. 1) so as to integrate a probe loader device therefore. Thereafter, in step 607, a circuit board is provided to be electrically connected to the first cantilever probe and the second cantilever probe so as to integrate a probe card device (not shown in figures).

However, the number of the stepped portions of the three-dimensional stepped structure 310 is not limited in the disclosure; one with ordinary skill in the art of the disclosure may decide the number of the stepped portions of the three-dimensional stepped structure according to actual requirements and restrictions.

In the above embodiment, the material of the carrier board 220 is made of ceramic or the like. The material of the first colloid body 710 and the second colloid body 720 respectively are resins such as epoxy resin and alike. However, the present disclosure is not limited thereto.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A probe loader device, comprising:
   a carrier board;
   at least one three-dimensional stepped structure connected to the carrier board, comprising a plurality of stepped portions, wherein the stepped portions are sequentially decremented along a direction of being away from the carrier board; and
   at least one probe module comprising a plurality of probe pin layers separately stacked together in the three-dimensional stepped structure, each of the probe pin layers comprising a plurality of cantilever probes which are arranged abreast, and the cantilever probes of the probe pin layers respectively extend outwards from the three-dimensional stepped structure through the different ones of the stepped portions, and the cantilever probes of the probe pin layers are used to touch a plurality of electrical contacts of a device under test (DUT), the cantilever probes of two neighboring ones of the probe pin layers are arranged staggered one another,
   wherein a portion of each of the cantilever probes extending outwards from the three-dimensional stepped structure has a moment length, and the moment lengths of the cantilever probes of the different probe pin layers are the same.

2. The probe loader device of claim 1, wherein the stepped portions further comprise:
   at least one first step surface surrounding to form a first space area, wherein a part of the cantilever probes extending outwards from the three-dimensional stepped structure through the first step surface;
   at least one second step surface surrounding to form a second space area which is in communication with the first space area and greater than the first space area, wherein another part of the cantilever probes extending outwards from the three-dimensional stepped structure through the second step surface; and
   at least one connecting surface adjoining the first step surface and the second step surface.

3. The probe loader device of claim 1, wherein the moment length of each of the cantilever probes is a minimum straight distance defined between a first virtual plane and a second virtual plane,
   wherein the first virtual plane and the second virtual plane are parallel to each other, the second virtual plane is same as a step surface of the three-dimensional stepped structure which one of the cantilever probes extends through, and the first virtual plane passes through a needle end of the one of the cantilever probes extending through the step surface.

4. The probe loader device of claim 1, wherein each of the cantilever probes comprises a suspended portion and a bending portion, the suspended portion is connected to the bending portion, and is partially embedded in the three-dimensional stepped structure, and a needle end of the bending portion is used to touch one of the electrical contacts.

5. The probe loader device of claim 1, wherein two neighboring ones of the probe pin layers are collectively disposed in one of the stepped portions.

6. The probe loader device of claim 1, wherein each of the probe pin layers is only disposed in one of the stepped portions.

7. The probe loader device of claim 1, wherein the carrier board comprises a through hole, a first main surface and a second main surface, the second main surface is opposite to the first main surface, and the through hole penetrates through the carrier board along an axial line of the through hole to connect the first main surface and the second main surface; and
   the at least one probe module and the at least one three-dimensional stepped structure are plural respectively, the three-dimensional stepped structures surround the axial line, and the cantilever probes fixed on the three-dimensional stepped structures collectively extend towards the axial line.

8. A probe card system, comprising:
   a platform having a load surface for carrying a device under test (DUT), wherein the DUT has an inner encirclement portion and an outer encirclement portion surrounding the inner encirclement portion, and the inner encirclement portion is provided with a plurality of first electrical contacts, and the outer encirclement portion is provided with a plurality of second electrical contacts; and
   a probe card device disposed on the platform, comprising:
   a circuit board; and
   a probe loader device, comprising:
      a carrier board;
      a pin holding portion disposed on one surface of the carrier board, comprising at least one three-dimensional stepped structure connected to the carrier board, and the three-dimensional stepped structure comprising at least one first step surface surrounding to form a first space area; at least one second step surface surrounding to form a second space area which is in communication with the first space area and greater than the first space area, and at least one connecting surface adjoining the first step surface and the second step surface; and
      at least one probe module electrically connected to the circuit board, comprising at least one first probe pin layer and at least one second probe pin layer, the first probe pin layer and the second probe pin layer separately stacked together in the pin holding portion, the first probe pin layer comprising a plurality of first cantilever probes respectively extending outwards from the three-dimensional stepped structure through the first step surface and touching the first electrical contacts, the second probe pin layer comprising a plurality of second cantilever probes respectively extending outwards from the three-dimensional stepped structure through the second step surface and touching the second electrical contacts, the first cantilever probes of the first probe pin layer and the second cantilever probes of the second probe pin later are arranged staggered one another, wherein a portion of each of the first cantilever probes extending outwards from the three-dimensional stepped structure has a first moment length, a portion of each of the second cantilever probes extending outwards from the three-dimensional stepped structure has a second moment length, and the first moment length is same as the second moment length.

9. A manufacturing method of a probe loader device, comprising:

disposing a first cantilever probe on a carrier board;

applying a first colloid body to cover the first cantilever probe and the carrier board;

curing the first colloid body to be a first curing layer so that the first cantilever probe is fixed in the first curing layer, wherein one portion of the first cantilever probe extends outwards from the first curing layer, and the portion of the first cantilever probe has a first moment length;

disposing a second cantilever probe on one surface of the first curing layer opposite to the carrier board;

applying a second colloid body to cover the second cantilever probe and the first curing layer; and curing the second colloid body to be a second curing layer which is more concaved inwardly than the first curing layer so that the second curing layer and the first curing layer collectively form a three-dimensional stepped structure, wherein the second cantilever probe is fixed in the second curing layer, and one portion of the second cantilever probe extends outwards from the second curing layer, and the portion of the second cantilever probe has a second moment length which is the same as the first moment length.

* * * * *